United States Patent [19]

Wang

[11] Patent Number: 4,683,383
[45] Date of Patent: Jul. 28, 1987

[54] DRIVER CIRCUIT FOR A THREE-STATE GATE ARRAY USING LOW DRIVING CURRENT

[75] Inventor: Hsienchin W. Wang, Milpitas, Calif.

[73] Assignee: Tandem Computers Incorporated, Cupertino, Calif.

[21] Appl. No.: 632,236

[22] Filed: Jul. 19, 1984

[51] Int. Cl.[4] .................. H03K 19/086; H03K 17/26; H03K 17/60
[52] U.S. Cl. .................................... 307/473; 307/443; 307/456; 307/549; 307/270
[58] Field of Search ................ 307/443, 473, 456–458, 307/542, 543, 549, 254, 270

[56] References Cited

U.S. PATENT DOCUMENTS

| | | | |
|---|---|---|---|
| Re. 29,982 | 5/1979 | Aoki | 307/473 |
| 3,641,362 | 2/1972 | Gamble | 307/443 X |
| 4,132,906 | 1/1979 | Allen | 307/443 |
| 4,255,670 | 3/1981 | Griffith | 307/473 |
| 4,322,640 | 3/1982 | Fukushima et al. | 307/473 |
| 4,467,223 | 8/1984 | Neely | 307/473 X |
| 4,481,430 | 11/1984 | Houk et al. | 307/473 X |
| 4,529,895 | 7/1985 | Garverick et al. | 307/473 |

FOREIGN PATENT DOCUMENTS

| | | | |
|---|---|---|---|
| 2533780 | 3/1984 | France | |
| 34230 | 4/1981 | Japan | 307/458 |
| 39624 | 3/1982 | Japan | 307/458 |
| 2128432 | 4/1984 | United Kingdom | 307/473 |

OTHER PUBLICATIONS

Mullgrav, Jr., "Three-State Feature FET-Level Push-Pull Driver", *IBM-TDB*, vol. 26, No. 7A, pp. 3253–3254, 12/1983.
"The TTL Data Book for Design Engineer", p. 6–35, published by Texas Instruments, 1976 edition.

*Primary Examiner*—Larry N. Anagnos
*Attorney, Agent, or Firm*—Finnegan, Henderson, Farabow, Garrett & Dunner

[57] ABSTRACT

A driver circuit for simultaneously setting up a plurality of output buffers of a 3-stage gate array into and out of a floating state using low control current. A buffer driver transistor is provided for each output buffer with the primary control path of that transistor introducing a control circuit to the respected output buffer. A common driver transistor has a primary current path which provides a control signal to the control electrodes of a plurality of buffer driver transistors. Clamp means are provided for discharging the conductor means to ground upon turn-off of the common driver transistor. Clamp means preferably includes a clamp transistor having a primary current path coupled between the conductor means and ground and having a differentiator coupled to the common driver transistor for detecting the leading edge of turn-off of that transistor and in response thereto momentarily, dynamically turning on the clamp transistor to couple the conductor means to ground and thereby discharge any effective capacitance of the conductor means to ground.

20 Claims, 4 Drawing Figures

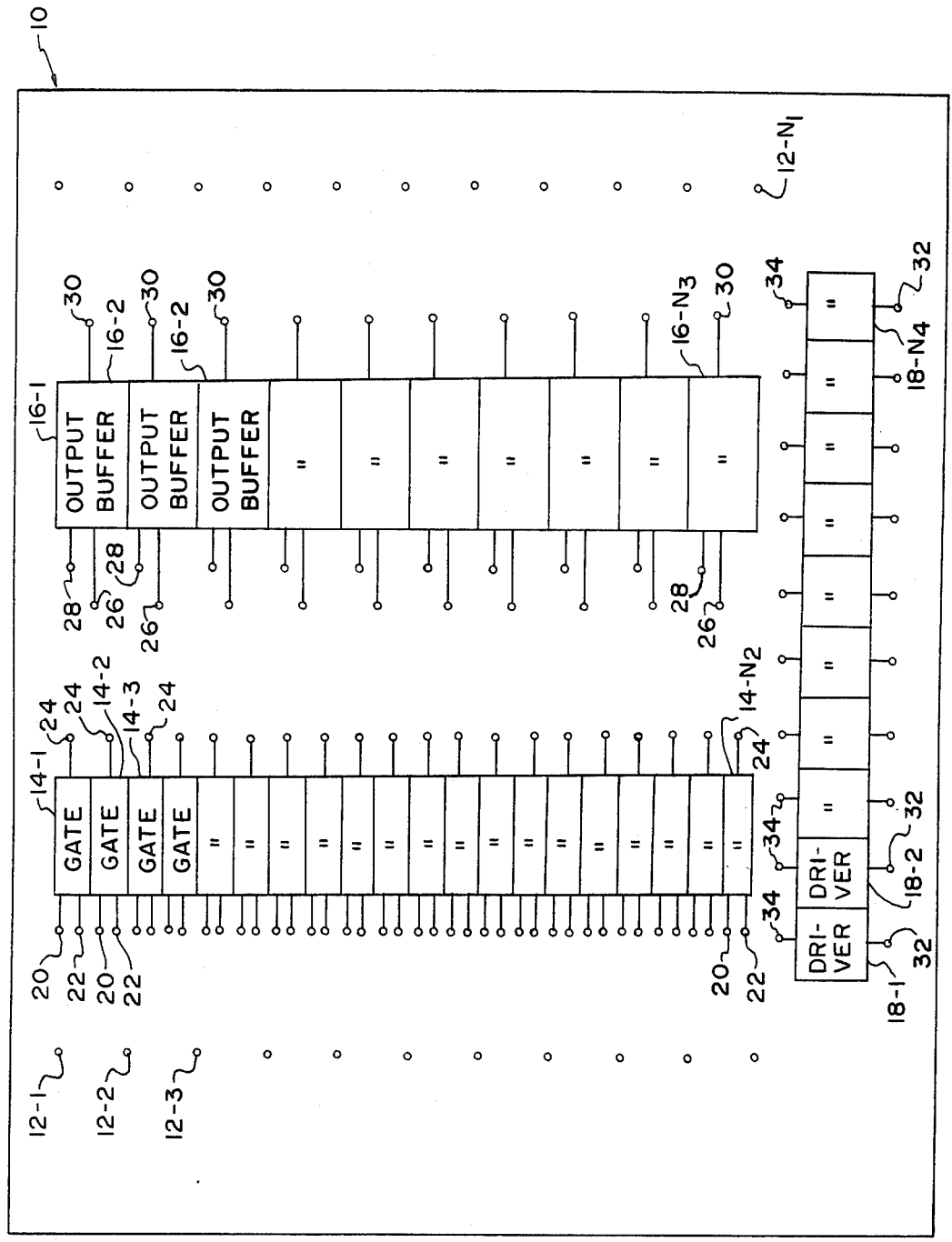
PRIOR ART FIG. 1

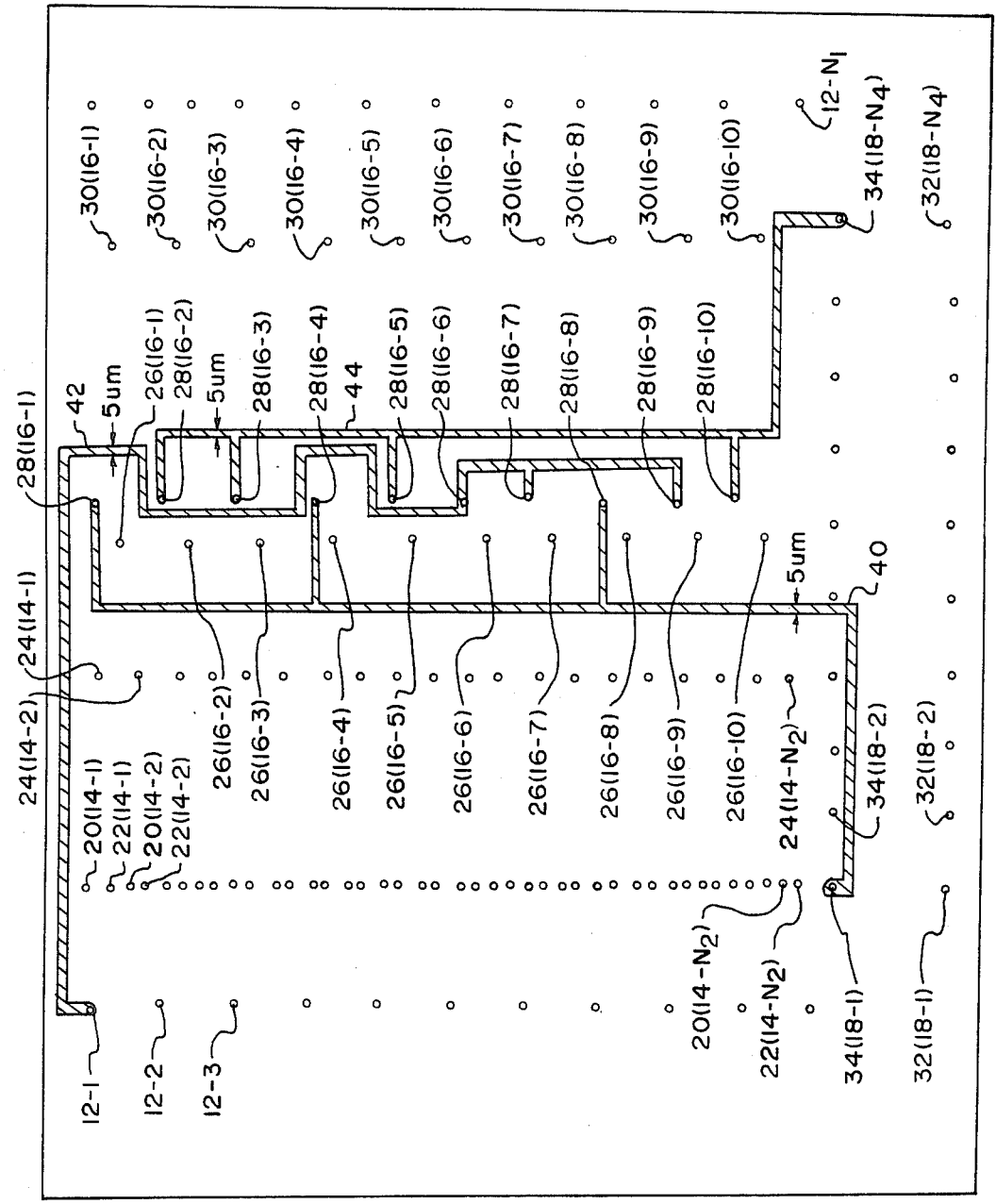
PRIOR ART FIG. 2

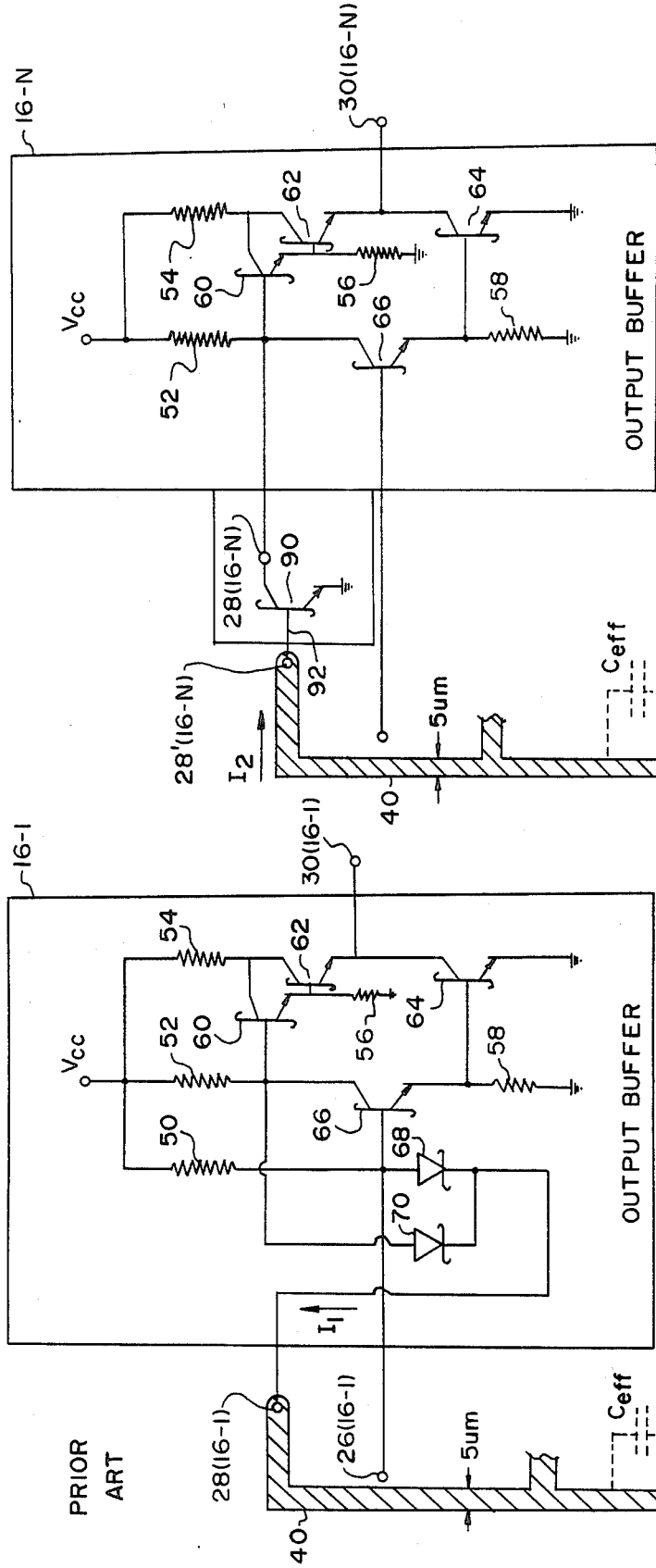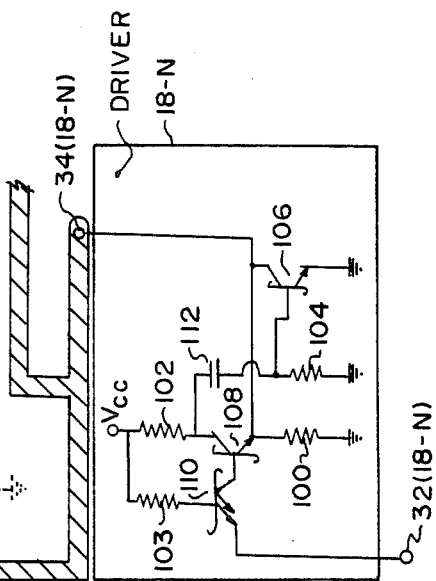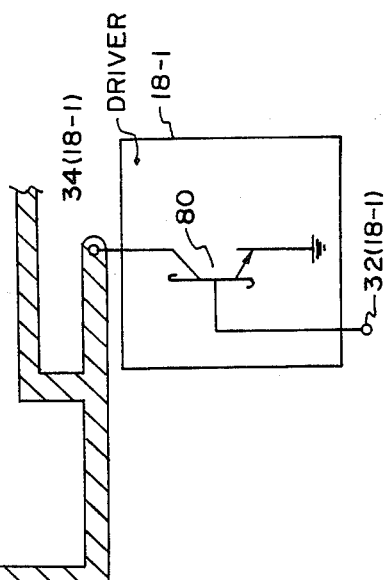
FIG. 4
FIG. 3
PRIOR ART

DRIVER CIRCUIT FOR A THREE-STATE GATE ARRAY USING LOW DRIVING CURRENT

BACKGROUND OF THE INVENTION

I. Field of the invention

The present invention relates to a driver circuit for simultaneously and rapidly setting a plurality of output buffers of a three-state gate array into and out of a floating third state with the employment of a low driving current.

II. Description of the Prior Art

Gate array circuits are well-known in the prior art. Such circuits typically include the standard configuration of components such as input/output pins, gates, output buffers, and drivers each having terminals which can be interconnected through one or more metallization layers. The user of such a gate array selects a particular standardized configuration of components and then designs a few unique metallization layer patterns to connect the standard configuration of components into a customized configuration. Such metallization layers are typically high density and, therefore, require as thin a width for each conductor in the metallization layer as possible.

As described in more detail below, prior art gate array circuits typically suffer from the requirement of a large current control signal for setting each member of a particular group of output buffers into a third or floating state. Since many output buffers are controlled simultaneously by the same third state control signal, preferably one control line would be used in a fan-out fashion to provide the third state control signal to a plurality of output buffers. However, in view of the large current requirements, standard width conductors cannot carry the current which would be required in such a fan-out arrangement. Accordingly, individual control lines are required for each third state control input of an output buffer, thereby negatively contributing to the density problem inherent in prior art gate arrays.

It is an object of the present invention to provide a driver circuit for a gate array which permits control of a floating state in a plurality of output buffers using a single, narrow width fanned-out conductor for each group of output buffers.

Additional objects and advantages of the invention will be set forth in part in the description which follows, and in part will be obvious from the description or may be learned from practice of the invention.

SUMMARY OF THE INVENTION

To achieve the foregoing objects, and in accordance with the purposes of the invention as embodied and broadly described herein, a driver circuit for simultaneously setting a plurality of output buffers of a three state gate array into and out of a floating third state is provided wherein the driver circuit comprises (a) a plurality of buffer driver transistors, one for each output buffer, with each buffer driver transistor having a primary current path coupled to a third state control input of a respective output buffer, and each buffer driver transistor further having a control electrode; (b) a first resistor; (c) a common driver transistor having a primary current path coupled to ground through the first resistor; (d) a conductor for connecting a junction of the common driver transistor primary current path and the first resistor to the control electrode of each buffer driver transistor; (e) a clamp circuit for discharging the conductor to ground upon turn-off of the common driver transistor, the clamp circuit including a clamp transistor having a primary current path coupled between the conductor and ground and having a control electrode, the clamp circuit further comprising a differentiator circuit coupled to the common driver transistor for detecting the leading edge of turn-off pulse of the common driver transistor and further coupled to the control electrode of the clamp transistor for momentarily turning on the clamp transistor upon detecting the leading edge and thereby rapidly clamping the conductor to ground.

BRIEF DESCRIPTION OF THE DRAWINGS

FIG. 1 is a block diagram of the component arrangement of an illustrative prior art gate array;

FIG. 2 is a diagram of a portion of a metallization layer for a prior art gate array;

FIG. 3 is a schematic diagram of an output buffer and driver of a prior art gate array; and FIG. 4 is a schematic illustration of a driver circuit built in accordance with the teachings of the subject invention.

DESCRIPTION OF THE PREFERRED EMBODIMENT

Reference will now be made to the drawings, including prior art FIGS. 1-3.

Three state gate arrays are well-known to those skilled in the art. One such array is symbolically illustrated in FIG. 1 as comprising on a chip 10 a plurality of input/output pins 12-1 through 12-$N_1$, a plurality of gates 14-1 through 14-$N_2$, a plurality of output buffers 16-1 through 16-$N_3$, and a plurality of drivers 18-1 through 18-$N_4$. Each of gates 14-1 through 14-$N_2$ is illustrated as having two input terminals 20, 22, and an output terminal 24. Each of output buffers 16-1 through 16-$N_3$ has a high/low input terminal 26, a third state control input terminal 28 and an output terminal 30. Each of drivers 18-1 through 18-$N_4$ has an input terminal 32 and an output terminal 34.

Pins 12-1 through 12-$N_1$ may be employed as input terminals or output terminals as desired by the ultimate user of chip 10. Each of gates 14-1 through 14-$N_2$ may have its input terminals 20, 22 connected to receive signals from pins 12-1 through 12-$N_1$ or may be connected to receive signals from an output terminal 24 of another of gates 14-1 through 14-$N_2$. Accordingly, gates 14-1 through 14-$N_2$ may be cascaded in a manner selected by the ultimate user.

Output buffers 16-1 through 16-$N_3$ deliver at their respective terminals 30 either an output high, an output low, or a floating state as is well-known to those skilled in the art. The output high and output low states at the output terminals 30 are governed by high/low control signals supplied at input control terminals 26. The third floating state of output terminals 30 is established by a third state control signal at input terminals 28. Any form of control signals to output buffers 16-1 through 16-$N_3$ may be delivered directly from a pin 12-1 through 12-$N_1$ through an external source or may be delivered from output terminals 34 of drivers 18-1 through 18-$N_4$. In such an instance, the respective input terminal 32 of drivers 18-1 through 18-$N_4$ may be connected either to an output 24 of a gate 14-1 through 14-$N_2$, or to an external signal through a pin 12-1 through 12-$N_1$.

It should be understood that FIG. 1 provides a simplified illustration of a gate array. For example, output buffers 16-1 through 16-$N_3$ of FIG. 1 may, in fact, include translators which enable output signals from gates 14-1 through 14-$N_2$ to generate the appropriate output signals at terminals 30 of output buffers 16-1 through 16-$N_3$. In addition, the number of gates, output buffers, drivers and input/output pins is illustrative of known prior art devices. In fact, hundreds of gates may be employed on a single chip. Also, additional circuitry may be employed beyond gates, output buffers and drivers on gate array chip 10.

The benefit of use of a gate array such as that illustrated in FIG. 1 is that a user may use a standard gate array chip 10 but configure the interconnection of the components on chip 10 in a manner unique to the user's needs. More specifically, one or more metallization layers may be placed on chip 10 in a manner that interconnects the various pins and terminals illustratively shown in FIG. 1.

For purposes of illustration and not limitation, a partial metallization layer 36 is shown in FIG. 2. Metallization layer 36 is shown in FIG. 2 to have access to input/output pins 12-1 through 12-$N_1$; input terminals 20 and 22 of gates 14-1 through 14-$N_2$; and input terminals 32 and output terminals 34 of drivers 18-1 through 18-$N_4$. In addition, metallization layer 36 is also shown to have access to the various input and output terminals of output buffers 16-1 through 16-10, with the number of output buffers in FIG. 2 arbitrarily selected for illustrative purposes to equal 10. Accordingly, high/low control input terminals 26(16-1) through 26(16-10) are illustrated in FIG. 2. In addition, third state control input terminals 28(16-1) through 28(16-10) are also illustrated, as are output terminals 30(16-1) through 30(16-10).

For purposes of illustration, assume that a user wishes to have output buffers 16-1, 16-4 and 16-8 controlled by output terminal 34 of driver 18-1. To achieve this result, a metallic wiring layer or conductor 40 is employed as part of metallization layer 36 which interconnects terminal 34(18-1), 28(16-1), 28(16-4), and 28(16-8). Typically, such a wiring layer has a standard width of approximately 5 microns. Further, assuming that the third state of output buffers 16-6, 16-7 and 16-9 is to be controlled by an external signal applied to input/output pin 12-1, there is provided in metallization layer 36 a second wiring layer or conductor 42 which interconnects pin 12-1, and terminal 28(16-6), 28(16-7) and 28(16-9). Again, wiring layer 42 typically has a width on the order of 5 microns. Finally, assuming the third state control for output buffers 16-2, 16-3 and 16-5 is to be dictated by the output of driver 18-$N_4$, there is provided in layer 36 a further conductor 44 which interconnects terminals 28(16-2), 28(16-3), 28(16-5) and 34(18-$N_4$). Once again, conductor 42 typically has a width on the order of 5 microns.

The width of conductors 40, 42 and 44, as may be fully appreciated by those skilled in the art, is mandated to be narrow, in view of the high degree of density typically experienced in gate array wiring layers, such as layer 36 illustrated in FIG. 2. Accordingly, the user of such a gate array is typically not at liberty arbitrarily to employ excessively wide wiring layers, but rather is typically restricted to the use of a standard width layer on the order of 5 microns.

In FIG. 3 there is illustrated a prior art output buffer circuit 16-1. Output buffer 16-1 is shown in FIG. 3 to include resistors 50, 52, 54, 56 and 58; Schottky transistors 60, 62, 64 and 66; and Schottky diodes 68 and 70. Schottky transistors 60 and 62 are coupled in a Darlington configuration with a common-collector connected through resistor 54 to a power source $V_{CC}$. The base of transistor 60 is connected through resistor 52 to power source $V_{CC}$. The emitter of transistor 60 is connected to ground through resistor 56 while the emitter of transistor 62 is connected to output terminal 30(16-1). Schottky transistor 66 has a collector connected to the junction between resistor 52 and the base of transistor 60, an emitter connected to high/low input terminal 26(16-1), and a base connected to high/low input terminal 26(16-1). Transistor 64 has a collector connected to output terminal 30(16-1), an emitter coupled to ground, and a base coupled to the junction of the emitter of transistor 66 and resistor 58. Resistor 58 couples the emitter of transistor 66 to ground.

In addition, Schottky diodes 68 and 70 have their cathodes connected in common to third state control input terminal 28(16-1). The anode of diode 68 is coupled to the base of transitor 66 and is further coupled to power supply $V_{CC}$ through resistor 50. The anode of Schottky diode 70 is coupled to the base of transistor 60.

In operation of output buffer 16-1, a low control signal may be applied to terminal 26(16-1) which is sufficient to turn transistor 66 off. A high control signal received at terminal 26(16-1) must be sufficient to turn transistor 66 on. Upon receipt of a low control signal, shutting transistor 66 off, transistor 64 is starved of base current and, therefore, is also turned off. However, the base of transistor 60 is drawn high and supplied base current from supply $V_{CC}$ through resistor 52. Accordingly, transistors 60 and 62 are both turned on pulling terminal 30(16-1) towards $V_{CC}$.

Upon receipt of a high control signal at terminal 26(16-1) sufficient to turn transistor 66 on, base current is thereby made available to transistor 64 turning on transistor 64 and driving terminal 30(16-1) to ground. At the same time, the base of transistor 60 is driven sufficiently low by conduction of transistor 66 to thereby turn transistors 60 and 62 off.

In order to set output terminal 30(16-1) in a third or floating state, both transistors 60 and 62 and transistor 64 must be turned off. To achieve this condition, a third state control signal is supplied at third state control input 28(16-1) which, in effect, couples terminal 28(16-1) to ground. For example, a driver 18-1 might be employed which comprises a Schottky transistor 80 having a collector-emitter path coupled between output terminal 34(18-1) of driver 18-1 and ground. The base of transistor 80 is coupled to driver input terminal 32(18-1). Upon conduction of transistor 80, terminal 34(18-1) is coupled to ground thereby providing a ground connection to the cathodes of Schottky diodes 68 and 70 through conductor 40. With diodes 68 and 70 conducting to ground, both transistors 66 and 60 are turned off, turning transistors 62 and 64 off, thereby placing output terminal 30(16-1) in a floating condition.

The output buffer arrangement of FIG. 3 has a primary disadvantage in that conductor 40 must be able to transmit on the order of two milliamps of current $I_1$ from diodes 68 and 70 for each output buffer coupled to conductor 40. Since, as a general rule, a 5 micron width conductor is capable of only a 2 milliamp capacity, if more than one output buffer is coupled to conductor 40 the width of conductor 40 would have to be dramatically increased. However, as explained above, gate array devices typically encounter high wiring density situations, thereby prohibiting an increase in the width of conductor 40. Since as many as ten or even more) different output buffers might be connected to a single conductor 40, the problem of conductor width is significant.

In the alternative to widening conductor 40, an individual conductor 40 of 5 micron width might be used for each output buffer connected to a driver. Once again, density rapidly becomes a problem.

In prior art selector circuits for turning on or off a group of transistors, such as in a memory array, instead of using Schottky diodes, individual Schottky transistors may be used with base current being supplied as a control signal to the individual transistors. Such a prior art arrangement precludes the need for a high control current on the order of two milliamps as is necessary in the arrangement in FIG. 3. However, long control lines such as conductors 40 inherently experience effective capacitance $C_{eff}$, which would tend to severely hamper the operational speed of an output buffer and thereby preclude such an arrangement from being used in a high speed gate array.

In accordance with the present invention, and more specifically, as illustrated in connection with the exemplary embodiment of FIG. 4, an output buffer 16-N is provided which includes resistors 52, 54, 56 and 58; and Schottky transistors 60, 62, 64 and 66 arranged in the same manner as was shown in output buffer 16-1 in FIG. 3. However, Schottky diodes 68 and 70 are replaced in output buffer 16-N by an additional Schottky transistor 90. Schottky transistor 90 has a collector connected through terminal 28(16-N) to the base of transistor 60, and an emitter coupled to ground. The base of transistor 90 is coupled to conductor 40 at a surrogate third state control input terminal 28'(16-N). If transistor 90 were made to conduct by presentation of a base current $I_2$, transistor 90 would thereby starve the base current of transistors 60 and 62, shutting off these transistors. In addition, the conduction of transistor 90 would couple the collector of transistor 66 to ground, thereby shutting transistor 66 and accompanying transistor 64 off to set output terminal 30(16-N) into a floating state.

As might be appreciated, current $I_2$ is substantially smaller than current $I_1$ of output buffer 16-1 and, therefore, multiple control base currents $I_2$ could theoretically be generated over a single conductor 40 of 5 micron width. However, conductor 40 has an effective capacitance $C_{eff}$. Accordingly, when the supply of current $I_2$ is removed, transistor 90 would not tend to shut off immediately, but rather would react sluggishly due to the discharging effect of capacitor $C_{eff}$ into conductor 40. This sluggish operation of transistor 90 is unacceptable and, accordingly, it is a primary object of the subject invention to eliminate the negative effect of effective capacitance $C_{eff}$ on a third state input control conductor, such as conductor 40.

To achieve the objective of the subject invention, Schottky diodes of the prior art, such as diodes 68 and 70 of FIG. 3, are replaced with a Schottky transistor 90 as illustrated in output buffer 16-N of FIG. 4. In addition, a driver is provided in accordance with the teachings of the subject invention which includes a clamp means for discharging the third state input control conductor to ground upon turn-off of the driver. The clamp means preferably includes a clamping transistor having a primary current path coupled between the conductor and ground. The clamp means of the subject invention further preferably comprises a differentiator means coupled to a common driver transistor of the driver for detecting the leading edge of turn-off of that common driver transistor and further coupled to the control electrode of the clamp transistor for momentarily, dynamically turning on the clamp transistor upon detection of the leading edge, and thereby rapidly clamping the third state input control conductor to ground.

By way of illustration and not limitation, reference will again be made to FIG. 4 to teach the preferred embodiment of the subject invention. In FIG. 4, a driver circuit is illustrated for simultaneously setting a plurality of output buffers such as buffer 16-N of a three state gate array into and out of a floating third state. The driver circuit illustrated in FIG. 4 includes a buffer transistor 90 in each output buffer 16-N, with the driver transistor 90 having a primary current path comprising, as illustratively shown in FIG. 4, an emitter collector current path coupled between third state control input terminal 28(16-N) of output buffer 16-N and ground. Buffer driver transistor 90 has a control electrode 92 coupled to a new terminal which in effect creates a new third state control input terminal 28'(16-N).

A driver 18-N is illustrated in FIG. 4 as including resistors 100, 102, 103 and 104; Schottky transistors 106, 108 and 110; and capacitor 112. Transistor 108 has a primary current path coupled to ground through resistor 100. This current path is also coupled to supply terminal $V_{CC}$ through resistor 102. Conductor 40 provides a means for connecting the junction of the primary current path of transistor 108 and resistor 100 to the gate electrode 92 of transistor 90. The control or gate electrode of transistor 108 is, in turn, coupled to the collector of multiple-emitter Schottky transistor 110. One of the emitters of transistors 110 is coupled to driver input terminal 32(18-N). The base of transistor 110 is coupled to power supply $V_{CC}$.

When transistor 110 is turned off, base current is supplied by the collector of transistor 110 to the base of transistor 108, turning transistor 108 on. With transistor 108 turned on, base current $I_2$ is supplied to transistor 90 thereby turning buffer driver transistor 90 on to couple the base of transistor 60 and the collector of transistor 66 to ground. In this condition, transistors 60, 62, 64 and 66 are all turned off, causing output terminal 30(16-N) to assume a floating state. To exit this floating state, transistor 108 is turned off by having transistor 110 turned on, thereby starving transistor 108 of base current. With transistor 108 turned off, the base of transistor 90 is coupled to ground through resistor 100. However, charge accumulated in effective capacitor $C_{eff}$ is discharged through resistor 100, thereby maintaining a temporary base current for transistor 90 and preventing rapid turn-off of transistor 90 as is required in proper operation of a gate array circuit.

To overcome the negative effects of capicator $C_{eff}$, a clamping circuit is provided which, as illustratively shown in FIG. 4, comprises resistor 104, transistor 106 and capacitor 112. Capicator 112 and resistor 104 are connected in series between the junction of resistor 102 and the primary current path of transistor 108 on the one hand and ground on the other. Accordingly, when transistor 108 is conductive, causing output buffer 16-N to enter a floating state, capacitor 112 holds a charge proportional to the voltage drop across transistor 108 and transistor 100. When transistor 108 turns off, resistor 104 and capacitor 112 act as a differentiator causing the junction of resistor 104 and capacitor 112 to immediately increase in potential, thereby immediately turning transistor 106 on and permitting the primary current path of transistor 106 to couple conductor 40 to ground, thereby rapidly discharging capacitor $C_{eff}$.

As a result of the subject invention, a driver circuit is provided for a gate array which may simultaneously drive a number of output buffers over an interconnecting conductor of standard five micron width without the expected negative influence of effective capacitance associated with that conductor. As a consequence, fan-out third state control of multiple output buffers throughout a gate array chip can be achieved using standard single or multilayer interconnect techniques. In this regard, simulated test results suggest that the presence of a clamping circuit in the driver of the subject invention improves the transition time $T_{ZL}$, which is the transition from a floating state to a low state, on the order of 8 nanoseconds in the case of a ten element fan out over what would be expected in the absence of that clamping circuit. Whereas this same transition time $T_{ZL}$ in the absence of resistor 104, transistor 106, and capacitor 112 was calculated to be approximately 14 nanoseconds.

It should be understood that the clamping circuit of the subject invention is dynamic in operation. That is to say, resistor 104 and capacitor 112 momentarily turned transistor 106 on upon turnoff of transistor 108. The duration of this momentary turn on is, of course, a function of the particular values selected for capacitor 112 and resistor 104. Suffice it to say that values should be chosen so that the dynamic activity of the clamping circuit is terminated after the effect of any charge on capacitor $C_{eff}$ is eliminated and before any subsequent need of a floating state is reasonably anticipated. Specifically, transistor 106 must once again be turned off after discharge of capacitor $C_{eff}$ rapidly enough so that conductor 40 might once again be used to conduct current $I_2$ by conduction of transistor 108 to place output terminal 30(16-N) in a floating state.

Additional advantages and modifications will readily occur to those skilled in the art. The invention in its broader aspects is not, therefore, limited to the specific details, representative methods and illustrative examples shown and described. Accordingly, departure may be made from such details without departing from the spirit or scope of applicant's general inventive concept.

I claim:

1. A driver circuit for simultaneously setting a plurality of output buffers of a three state gate array into and out of a floating third state, said driving circuit comprising:
  a. a plurality of buffer driver transistors, one for each output buffer, with each buffer driver transistor having a primary current path coupled to a third state control input of a respective output buffer, and each buffer driver transistor further having a control electrode;
  b. a first resistor;
  c. a common driver transistor having a primary current path coupled to ground through said first resistor;
  d. conductor means for connecting the junction of said common driver transistor primary current path and said first resistor to the control electrode of each of said buffer driver transistors;
  e. clamp means for discharging said conductor means to ground upon turn-off of said common driver transistor, said clamp means including a clamp transistor having a primary current path coupled between said conductor means and ground and having a control electrode; said clamp means further comprising differentiator means, coupled to said common driver transistor, and to said control electrode of said clamp transistor, for detecting and responding to the leading edge of a signal at a node coupling said differentiator means to said common driver transistor, indicative of said turn-off of said common driver transistor, to momentarily turn ON said clamp transistor and thereby rapidly clamp said conductor means to ground.

2. The driver circuit of claim 1 wherein said buffer driver transistors are each a Schottky transistor.

3. The driver circuit of claim 1 wherein said common driver transistor is a Schottky transistor.

4. The driver circuit of claim 1 wherein said clamp transistor is a Schottky transistor.

5. The driver circuit of claim 1 wherein said buffer driver transistors are each a Schottky transistor and wherein said common driver transistor is a Schottky transistor.

6. The driver circuit of claim 1 wherein said common driver transistor and said clamp transistor are both Schottky transistors.

7. The driver circuit of claim 1 wherein said buffer driver transistors are each a Schottky transistor and wherein said clamp transistor is a Schottky transistor.

8. The driver circuit of claim 1 wherein said buffer driver transistors, said common driver transistor, and said clamp transistor are each a Schottky transistor.

9. The driver circuit of claim 1 wherein said conductor means is located in a metallization layer of said gate array.

10. The driver circuit of claim 1 wherein said output buffers are divided into N groups of more than one output buffer per group and said driver circuit comprises N first resistors, N common driver transistors, and N clamp means, wherein N is an integer greater than 1, with each first resistor, common driver transistor and clamp means associated with a respective one of said groups of output buffers.

11. A driver circuit for simultaneously setting a plurality of output buffers of a three state gate array into and out of a floating third state, wherein said output buffers each include a Schottky control transistor having a control electrode responsive to a high and low state control signal to set said buffers into a low and high state, respectively; said driver circuit comprising:
  a. a plurality of buffer driver transistors, one for each output buffer, with each buffer driver transistor having a collector coupled to the collector of a respective Schottky control transistor, an emitter coupled to ground, and a gate electrode;
  b. a first resistor;
  c. a power source;
  d. a common driver transistor having a collector coupled to said power source, an emitter coupled to ground through said first resistor, and a gate electrode;
  e. conductor means connecting the emitter of said common driver transistor to the gate electrode of each of said buffer driver transistors; and
  f. clamp means for discharging said conductor means to ground upon turn-off of said common driver transistor, said clamp means including a clamp transistor having a collector coupled to said conductor means, an emitter coupled to ground, and a gate electrode; said clamp means further comprising differentiator means having a second resistor coupled between the gate of said clamp transistor and ground, and having a capacitor coupled between the collector of said common driver transistor and the gate of said clamp transistor, whereby upon turn-off of said common driver transistor, said clamp transistor is momentarily turned on thereby rapidly clamping said conductor means to ground.

12. The driver circuit of claim 11 wherein said buffer driver transistors are each a Schottky transistor.

13. The driver circuit of claim 11 wherein said common driver transistor is a Schottky transistor.

14. The driver circuit of claim 11 wherein said clamp transistor is a Schottky transistor.

15. The driver circuit of claim 11 wherein said buffer driver transistors are each a Schottky transistor and said common driver transistor is a Schottky transistor.

16. The driver circuit of claim 11 wherein said common driver transistor and said clamp transistor are both Schottky tran- sistors.

17. The driver circuit of claim 11 wherein said buffer driver transistors are each a Schottky transistor and said clamp transistor is a Schottky transistor.

18. The driver circuit of claim 11 wherein said buffer driver transistors, said common driver transistor and said clamp transistor is each a Schottky transistor.

19. The driver circuit of claim 11 wherein said conductor means is located in a metallization layer of said gate array.

20. The driver circuit of claim 11 wherein said output buffers are divided into N groups of more than one output buffer per group and said driver circuit comprises N first resistors, N common driver transistors, and N clamp means, where N is an integer greater than 1, with each first resistor, common driver transistor and clamp means associated with a respective one of said groups of output buffers.

* * * * *